United States Patent
Rivero et al.

(10) Patent No.: US 10,157,720 B2
(45) Date of Patent: Dec. 18, 2018

(54) INTEGRATED MECHANICAL DEVICE WITH VERTICAL MOVEMENT

(71) Applicant: STMicroelectronics (Rousset) SAS, Rousset (FR)

(72) Inventors: Christian Rivero, Rousset (FR); Pascal Fornara, Pourrières (FR); Antonio di-Giacomo, Rousset (FR); Brice Arrazat, Marignane (FR)

(73) Assignee: STMICROELECTRONICS (ROUSSET) SAS, Rousset (FR)

(*) Notice: Subject to any disclaimer, the term of this patent is extended or adjusted under 35 U.S.C. 154(b) by 291 days.

(21) Appl. No.: 14/517,369

(22) Filed: Oct. 17, 2014

(65) Prior Publication Data

US 2015/0116072 A1 Apr. 30, 2015

(30) Foreign Application Priority Data

Oct. 29, 2013 (FR) .................................. 13 60538

(51) Int. Cl.
| | | |
|---|---|---|
| *H01H 61/02* | (2006.01) | |
| *H01H 1/58* | (2006.01) | |
| *H01H 9/02* | (2006.01) | |
| *B81B 3/00* | (2006.01) | |

(52) U.S. Cl.
CPC ........... *H01H 61/02* (2013.01); *B81B 3/0021* (2013.01); *H01H 1/58* (2013.01); *H01H 9/02* (2013.01); *B81B 2201/031* (2013.01); *B81B 2203/053* (2013.01)

(58) Field of Classification Search
CPC ........... H01H 61/02; H01H 1/58; H01H 9/02; H01H 2037/5463; H01H 2037/008; H01H 61/00; H01H 73/00; H01H 83/00; H01H 37/00; H01H 37/02; H01H 37/32; H01H 81/02; H02H 5/047; B81B 3/0021; B81B 2201/031; B81B 2203/053
USPC ..................................................... 337/85, 14
See application file for complete search history.

(56) References Cited

U.S. PATENT DOCUMENTS

| | | | | |
|---|---|---|---|---|
| 6,906,905 | B1 * | 6/2005 | Chinthakindi | ........... H01G 5/18 361/277 |
| 8,441,038 | B1 * | 5/2013 | Trimberger | ............. H01L 23/52 257/209 |
| 9,006,897 | B2 | 4/2015 | Di-Giacomo | |
| 2003/0116417 | A1 * | 6/2003 | DeReus | ................ B81B 3/0024 200/181 |
| 2004/0201314 | A1 * | 10/2004 | Wong | ..................... H01H 57/00 310/328 |
| 2008/0079120 | A1 * | 4/2008 | Foster | ..................... B81B 7/007 257/619 |
| 2009/0174014 | A1 * | 7/2009 | Kunze | .................. B81B 3/0024 257/415 |

(Continued)

FOREIGN PATENT DOCUMENTS

FR 3000841 A1 7/2014

*Primary Examiner* — Jerry Wu
*Assistant Examiner* — Stephen Sul
(74) *Attorney, Agent, or Firm* — Slater Matsil, LLP

(57) ABSTRACT

A device includes a thermally deformable assembly accommodated in a cavity of the interconnection part of an integrated circuit. The assembly can bend when there is a variation in temperature, so that its free end zone is displaced vertically. The assembly can be formed in the back end of line of the integrated circuit.

17 Claims, 8 Drawing Sheets

(56) References Cited

U.S. PATENT DOCUMENTS

| | | | |
|---|---|---|---|
| 2010/0141362 A1* | 6/2010 | Lee | H01P 1/127 |
| | | | 333/262 |
| 2011/0038093 A1* | 2/2011 | Furukawa | B81B 3/0072 |
| | | | 361/277 |
| 2011/0073188 A1* | 3/2011 | Marcus | F16K 99/0001 |
| | | | 137/1 |
| 2012/0126433 A1* | 5/2012 | Montanya Silvestre | B81C 1/00246 |
| | | | 257/787 |
| 2012/0265474 A1* | 10/2012 | Rearick | G06F 19/22 |
| | | | 702/104 |
| 2013/0242636 A1* | 9/2013 | Pagani | H01H 1/0036 |
| | | | 365/129 |
| 2013/0271938 A1* | 10/2013 | Lindert | H05K 1/182 |
| | | | 361/782 |

\* cited by examiner

INTEGRATED MECHANICAL DEVICE WITH VERTICAL MOVEMENT

This application claims the benefit of French Application No. 1360538, filed on Oct. 29, 2013, which application is hereby incorporated herein by reference.

TECHNICAL FIELD

The invention relates to integrated circuits, and more particularly to an integrated mechanical device with vertical movement.

BACKGROUND

Currently, the switching devices produced within integrated circuits are generally switches of the micro-electromechanical system (MEMS) type using polysilicon elements. However, the technology used to produce such switches is a dedicated technology which is difficult to integrate in a standard CMOS technological line.

French Patent Application No. 2,984,009 and U.S. Pat. No. 8,692,247 have proposed a mechanical electrical switching device that can be integrated in CMOS technology lines. This device does not use the conventional technology of the MEMS type and is based on an asymmetrical two-dimensional structure produced in a single metallization level, which allows a beam to be displaced in the plane of this metallization level when there is a temperature variation.

French Patent Application No. 2,984,010 and U.S. Pat. No. 8,704,327 propose to use the planar displacement of such a structure in order to produce a capacitive device having a capacitive value which is variable as a function of temperature.

These two-dimensional devices, extending parallel to the surface of the substrate of the integrated circuit, although being entirely satisfactory may, in certain cases, offer a small useful surface between the fixed part and the mobile part, leading to a small contact surface in some applications.

SUMMARY

Embodiments of the invention relate to electrical switching devices such as interrupters or switches, in particular examples thermally or electrically activatable mechanical devices with vertical movement, but also integrated capacitive devices having a thermally variable capacitive value.

According to one embodiment, an integrated mechanical device comprises an element that is mobile in a direction perpendicular to the surface of the substrate, that is to say a substantially vertical direction. The two-dimensional structures of the prior art have not made this movement possible. With this embodiment, it is possible to offer larger facing surfaces between the fixed part and the mobile part.

According to another embodiment, such an integrated mechanical device is provided which is electrically activatable so as to increase the temperature of a certain part of the device in order to deform it. The device moreover is insensitive to variations in ambient temperature.

According to one embodiment, it is proposed to use a thermally deformable assembly based on the coupling of materials with different coefficients of thermal expansion. This makes it possible to obtain reproducible movements along a direction substantially perpendicular to the surface of the substrate of the integrated circuit, that is to say a substantially vertical direction, and in both directions.

Furthermore, the mobile free end of the device may then have a larger surface facing a fixed body than in the case of the two-dimensional structures with planar displacement of the prior art.

According to one aspect, an integrated circuit comprises, above a substrate, an interconnection region having, within an insulating region, a plurality of metallization levels and at least one via level. Such a part is commonly referred to by those skilled in the art under the acronym "BEOL" (back end of line).

According to a general characteristic of this aspect, the integrated circuit furthermore comprises, within the interconnection region, a device having a thermally deformable electrically conductive assembly extending at least partly in a cavity of the interconnection region and having a free end zone which is mobile in the cavity in a direction substantially perpendicular to the mid-plane of the metallization levels, that is to say perpendicular to the surface of the substrate.

The assembly includes a first element located within a first metallization level and a second element secured to the first element and located within a first via level adjacent to the first metallization level. It should be noted here that the term "first," associated with a metallization level or a via level, denotes a particular metallization or via level without this level actually being the first level of the interconnection region.

The first element and the second element respectively have materials with different coefficients of thermal expansion.

The device also has an electrically conductive body arranged at least partly in the cavity.

The assembly has different configurations corresponding respectively to different distances along the direction between the free end zone and the electrically conductive body, the assembly being activatable in order to change from one configuration to another.

In certain cases, the thermally deformable assembly may be thermally activatable as a result of a variation in ambient temperature, or electrically activatable by a current flowing through the assembly so as to increase its temperature. In other configurations, the thermally deformable assembly may be insensitive to variations in ambient temperature and only electrically activatable.

Whatever the case, when the free end zone does not touch the electrically conductive body but remains at a distance therefrom, it is then possible to vary this distance by thermally deforming the assembly, thus producing a capacitive device having a variable capacitance.

As a variant, the device may be used as an electrical switching device, for example when one of the configurations corresponds to a zero distance, the free end zone then being in contact with the body so as to establish an electrical connection passing through this body and the assembly. Furthermore, when in another configuration the free end zone is not in contact with the body, the electrical switching device interrupts the electrical connection.

According to one embodiment, the first element may comprise a first metal which is the same as the metal of the first metallization level, and the second element may comprise at least one metal portion having a second metal which is the same as the metal of the first metal via level but different from the first metal. This is the case when the metallization levels are formed from a first metal, for example, aluminum, whereas the via levels are formed from a second metal, for example tungsten.

As a variant, when the first metallization level and the first via level have the same metals, for example copper, the second element may then comprise at least one insulating portion, for example of silicon dioxide, between at least two metal portions, for example, of copper.

According to one embodiment, the assembly has a fixed end zone opposite the free end zone. The assembly is then mounted overhanging and is mobile by bending in the cavity.

Although this is not indispensable, it is advantageous for the fixed end zone of the assembly to be located in the interconnection region (BEOL) outside the cavity, a part of the assembly then passing through an opening formed in a wall of the cavity while being at a distance from the edges of the opening. This makes it possible, in particular, to be able to apply a voltage to the assembly so as to make a current flow through it in order to increase its temperature, without having to bias the walls of the cavity.

The different elements of the assembly may have varied geometries.

Thus, according to one embodiment, the first element of the assembly may be U-shaped having two parallel branches connected by a connecting branch, the free end zone of the assembly having the connecting branch, and the second element of the assembly has at least one straight portion extending under each of the two parallel branches as far as the free end zone.

When the assembly is electrically activatable, the first element is advantageously configured in order to allow an electrical current to pass through it at least partly, in order to increase the temperature.

In this regard, the integrated circuit may have circuitry capable of applying an electrical voltage between two points of the first element so as to generate the current.

This being the case, as indicated above, as a variant the assembly may be insensitive to variations in ambient temperature.

This is the case, in particular, when the assembly furthermore comprises a third element and a connection element. The third element is the same as the first element and is located facing the first element within a second metallization level separated from the first metallization level by the first via level. The connection element is located within the first via level, is secured to the first element and the third element, and forms a second element common to the first element and to the third element. This is the case, in particular, when this connection element has one or more lines of metal vias, for example, made of tungsten. Alternatively, the connection element contains two second elements respectively secured to the first element and to the third element. This is the case, in particular, when these second elements are formed by residual silicon dioxide portions, which are then respectively in contact with the first element and the third element.

When such an assembly is electrically activatable, the first element and the third element are advantageously each configured in order to allow an electrical current to flow through it at least partly, so as to increase its temperature, and the integrated circuit furthermore comprises means configured in order to selectively generate the current in the first element or in the second element, which will make it possible to make the free end zone bend in one direction or the other along the substantially vertical direction.

BRIEF DESCRIPTION OF THE DRAWINGS

Other advantages and characteristics of the invention will become apparent on studying the detailed description of entirely nonlimiting embodiments and the appended drawings, in which.

DETAILED DESCRIPTION OF ILLUSTRATIVE EMBODIMENTS

Figure 1:
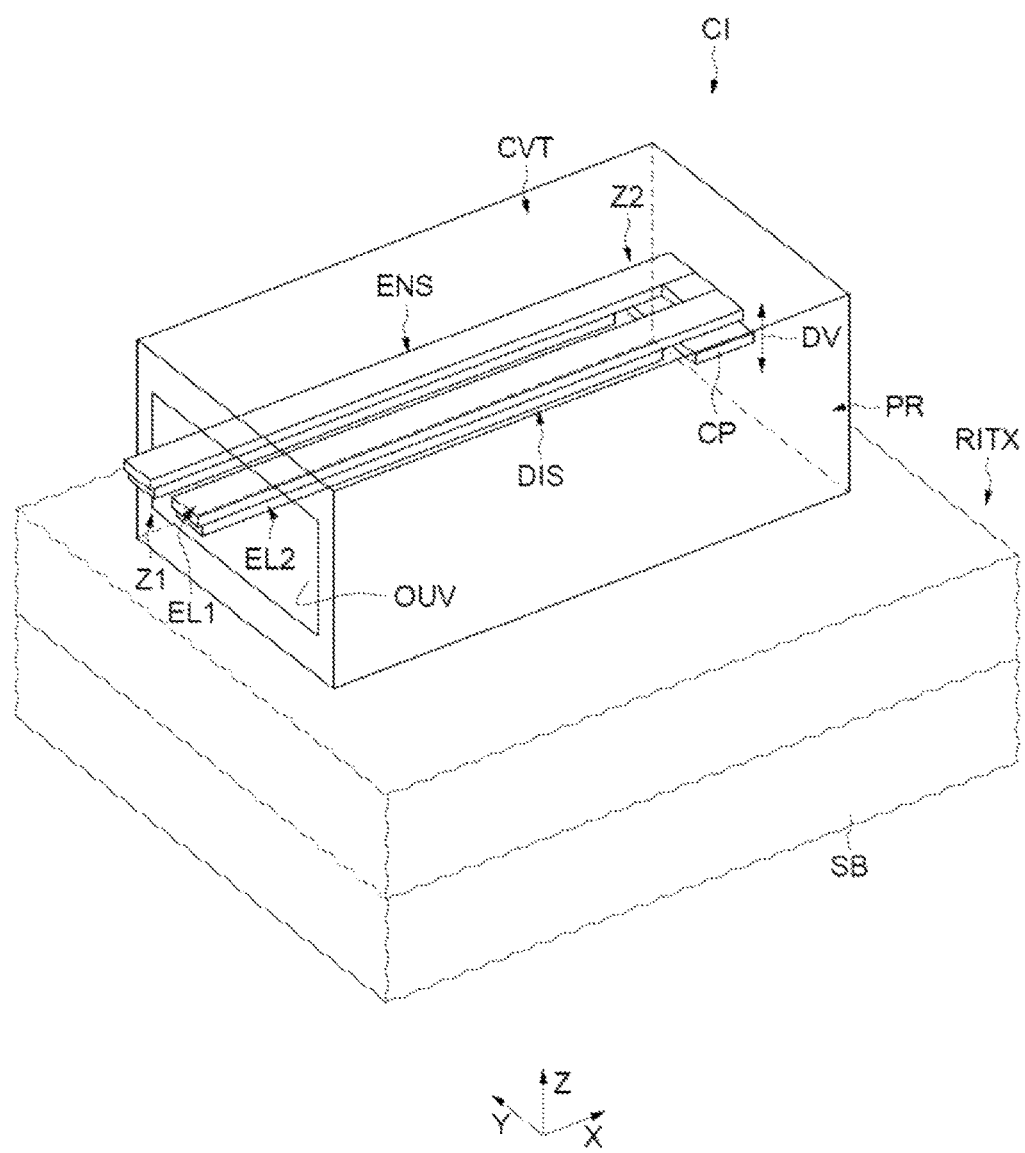
FIGS. 1 to 14, which are essentially schematic, relate to various embodiments of a device according to the invention.

In FIG. 1, the device DIS is produced within the interconnection part RITX commonly referred to by the person skilled in the art by the acronym BEOL.

This part RITX is located above a substrate SB of the integrated circuit and has, in the conventional way, metallization levels and via levels. In the embodiment described here, the device DIS has an assembly ENS extending partially in a cavity CVT delimited by walls PR within the interconnection part RITX. It will be seen in more detail below that these walls are formed by barriers arranged at different metallization and via levels.

The assembly ENS has a first end zone Z1, which is located outside the cavity CVT and is fixed in the interconnection part RITX. This first end zone may, for example, be connected to external metallizations.

The assembly ENS furthermore has a second end zone Z2 opposite the first end zone Z1. This second end zone Z2 is a free end zone and is mobile in the direction DV that is a direction substantially parallel to the Z axis, that is to say, substantially perpendicular to the surface of the substrate SB, which extends in the plane XY.

As will be seen in more detail below, the assembly ENS has a first element EL1 produced at a first metallization level and a second element EL2 produced at a first via level that is adjacent to the first metallization level. In the example of FIG. 1, the element EL2 lies below the element EL1, although it could be located above.

The device DIS furthermore has, in the cavity CVT, a fixed body CP which is produced here at the metallization level located below the via level within which the second element EL2 is produced.

As will be seen in more detail below, the assembly ENS and the fixed body CP are produced by using conventional techniques for producing metal tracks and vias of the interconnection part RITX, which are employed particularly in CMOS technology.

Figure 2:
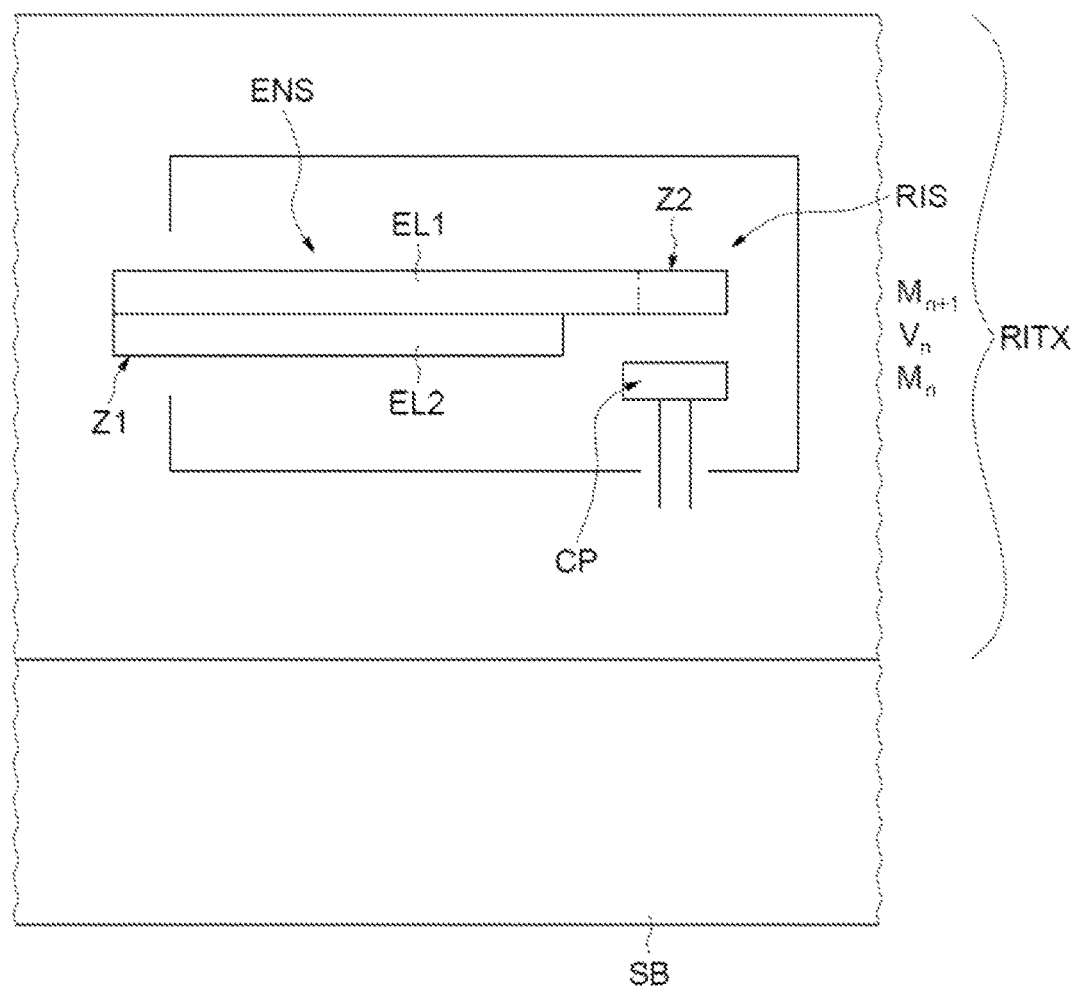

FIG. 2 shows the assembly ENS and the body CP encapsulated in an insulating region RIS of the interconnection part RITX. This region RIS has in particular, in the conventional way, insulating materials, for example silicon dioxide.

Figure 3:
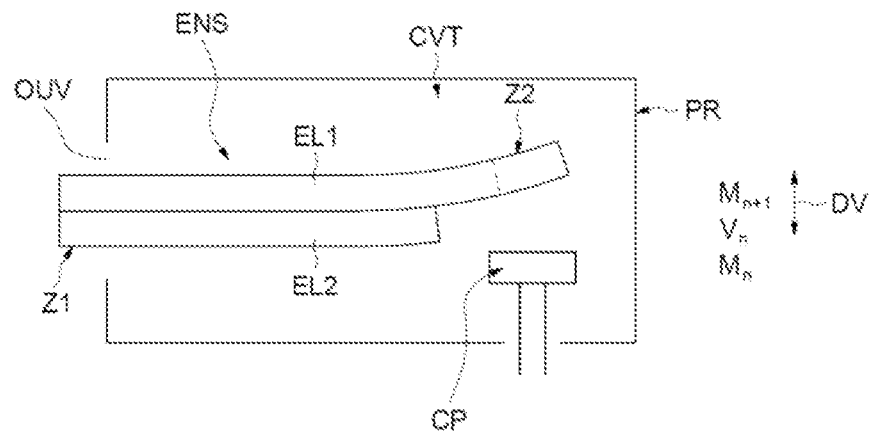

FIG. 3 shows the assembly ENS and the body CP after de-encapsulation, that is to say removal of the insulating region RIS, which has made it possible to define the cavity CVT delimited by the walls PR.

Depending on the nature of the materials forming the first element EL1 and the second element EL2 of the assembly ENS, as well as on the relative position of the elements EL1 and EL2, the assembly ENS may, during its release, exhibit slight bending as illustrated schematically in FIG. 3. Thus, when the first element EL1 comprises aluminum and the second element EL2 comprises lines of tungsten, the aluminum and tungsten are under tension during their production and, when this structure is released by removing the insulating region RIS from the cavity CVT, the structure will tend to rise as schematically illustrated in FIG. 3.

In the exemplary embodiment illustrated in FIGS. 2 and 3, the fixed body CP has a platform produced at the metallization level $M_n$, extended by a connection passing through the bottom wall of the cavity to be connected, for example, to an external metallization element. The first element EL1 is produced at the metallization level $M_{n+1}$, and the second element EL2 is produced at the via level $V_n$.

Figure 4:
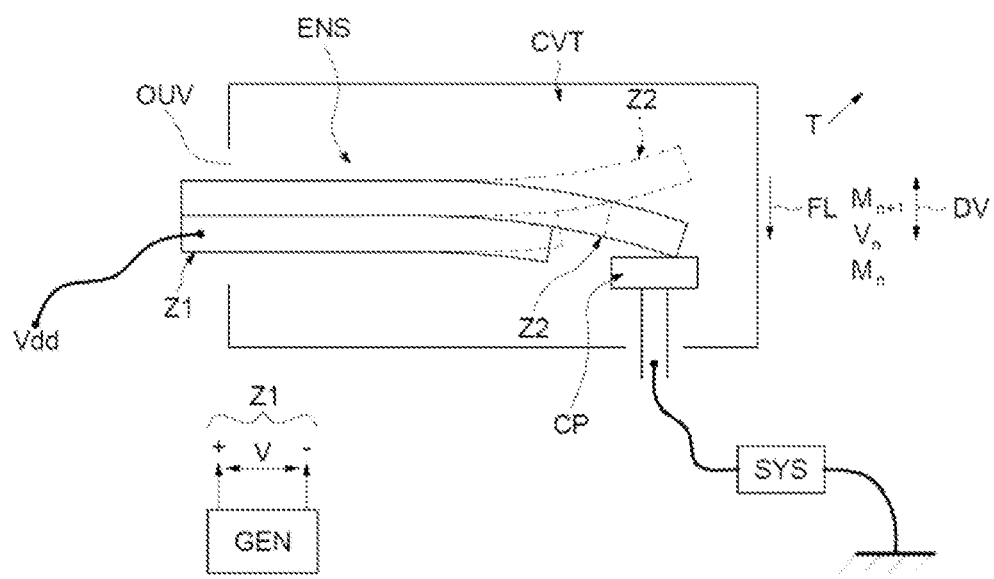

Since the two materials respectively forming the elements EL1 and EL2 of the assembly ENS have different coefficients of thermal expansion, the assembly ENS can, as illustrated in FIG. 4, be deformed thermally and change from one configuration to another during a change in the ambient temperature, for example.

First, in the case in which the first element EL1 comprises aluminum and the second element EL2 comprises tungsten, a rise in the temperature T will cause the free end zone Z2 to descend downward, that is to say along the arrow FL in FIG. 4. Of course, if the tungsten were to be replaced with a material having an expansion coefficient higher than that of aluminum, a reverse movement would then be obtained.

In the example illustrated in FIG. 4, the rise in temperature T brings the assembly ENS into a configuration in which the free end zone Z2 comes in contact with the fixed body CP.

Furthermore, as illustrated very schematically in this figure, the device DIS may then be used as an electrical switch making it possible to establish or not establish an electrical connection passing through the assembly ENS and the fixed body CP.

Specifically, if a voltage Vdd is applied to the first fixed zone Z1 and the fixed body CP is connected by means of a line to a system SYS, which is itself grounded, then in this example an interrupter has been produced which is normally OFF or which is ON when there is a rising temperature T.

When the assembly ENS is for example U-shaped, as illustrated in FIG. 1, it is also possible to apply a voltage V in the first fixed zone Z1 between the two parallel branches of the U with the aid of a generator GEN so that a current flows through the assembly ENS, which will make it possible to raise its temperature by the Joule effect so as to thermally deform it and make it change from one configuration to another.

Figure 5:
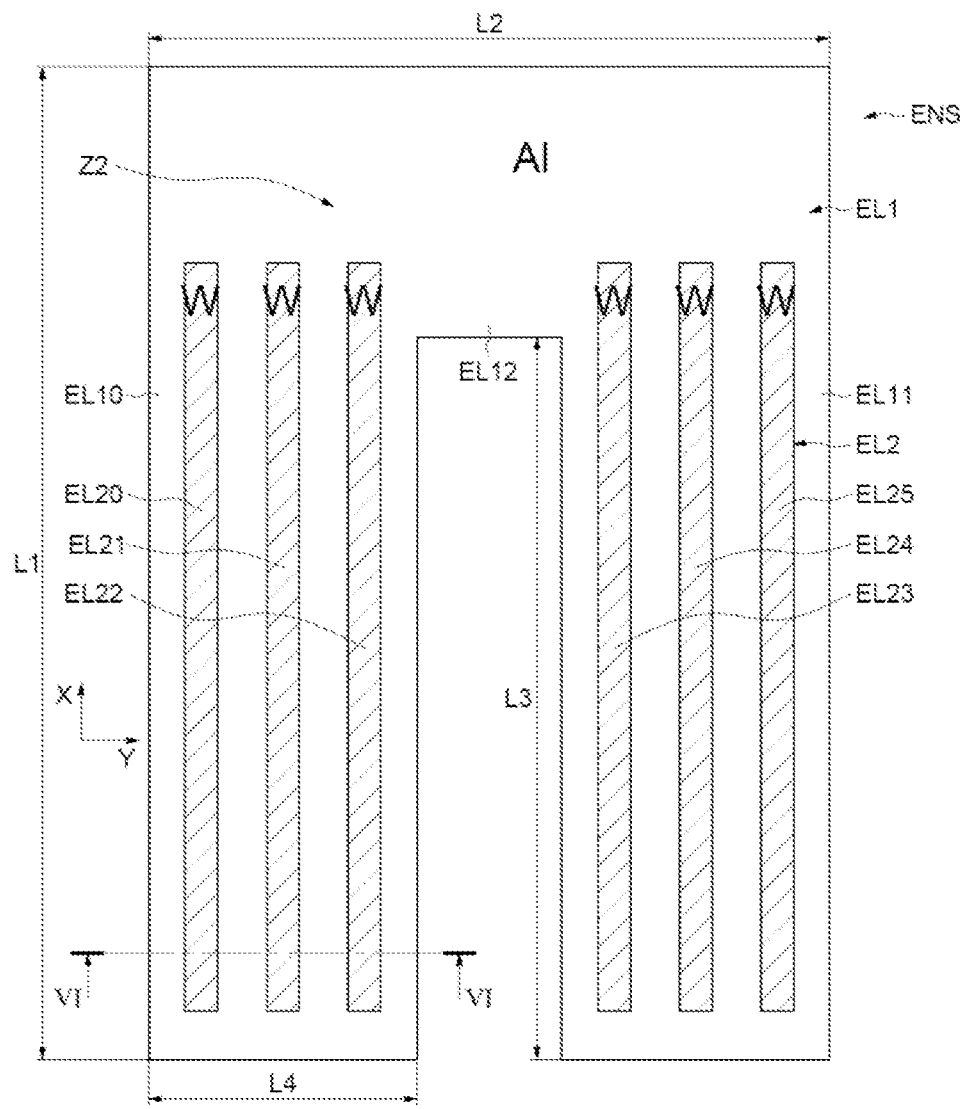
Figure 6:
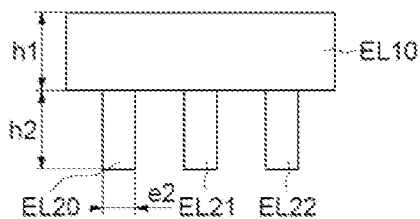

FIGS. 5 and 6 schematically illustrate a more specific exemplary embodiment of an assembly ENS.

More precisely, the first element EL1 of the assembly ENS is U-shaped and is formed from aluminum, which is the metal constituting the metal lines of the various metallization levels of the interconnection part RITX.

The first element EL1 thus has two parallel branches EL10 and EL11 connected by a connecting branch EL12.

Furthermore, as illustrated in FIG. 5 as well as in FIG. 6, which is a section along the line VI-VI of FIG. 5, it can be seen that the second element EL2 here has three straight portions EL20, EL21, EL22 extending under the branch EL10 and three other metal portions EL23, EL24, EL25 extending under the other branch EL11 of the first element EL1. These metal portions are formed here from tungsten (W), which is the metal forming the via levels of the interconnection part RITX. In an alternative embodiment, merely a single straight portion of tungsten could be formed under each branch EL10, EL11.

As illustrated in FIG. 6, the metal portions EL20-EL25 of the second element EL2 are located under the first element EL1, therefore leading to bending of the free end zone Z2 downwards, that is to say towards the substrate, when the temperature of the assembly ENS rises. This is because the coefficient of thermal expansion of aluminum is greater than that of tungsten.

The length L1 of the element EL1 is for example equal to 31 µm, the width L2 of the connection branch EL12 is for example equal to 3 µm, and the length L3 of each of the parallel branches EL10 and EL11 is for example equal to 30 µm. Furthermore, the width L4 of each parallel branch is for example equal to 1.52 µm, whereas the height h1 of the first element EL1 is for example equal to 0.24 µm.

The height h2 of the metal portions EL20-EL25 of the second element is for example equal to 0.5 µm, and the thickness e2 of these metal portions is for example equal to 0.24 µm.

With such dimensions, bending of the free end zone Z2 with an amplitude of 1.4 µm is typically obtained when there is a temperature rise at the hottest point (at the end of the zone Z2) with an amplitude of 400° C., obtained by the Joule effect when a current of 75 mA flows through the assembly ENS.

Figure 7:
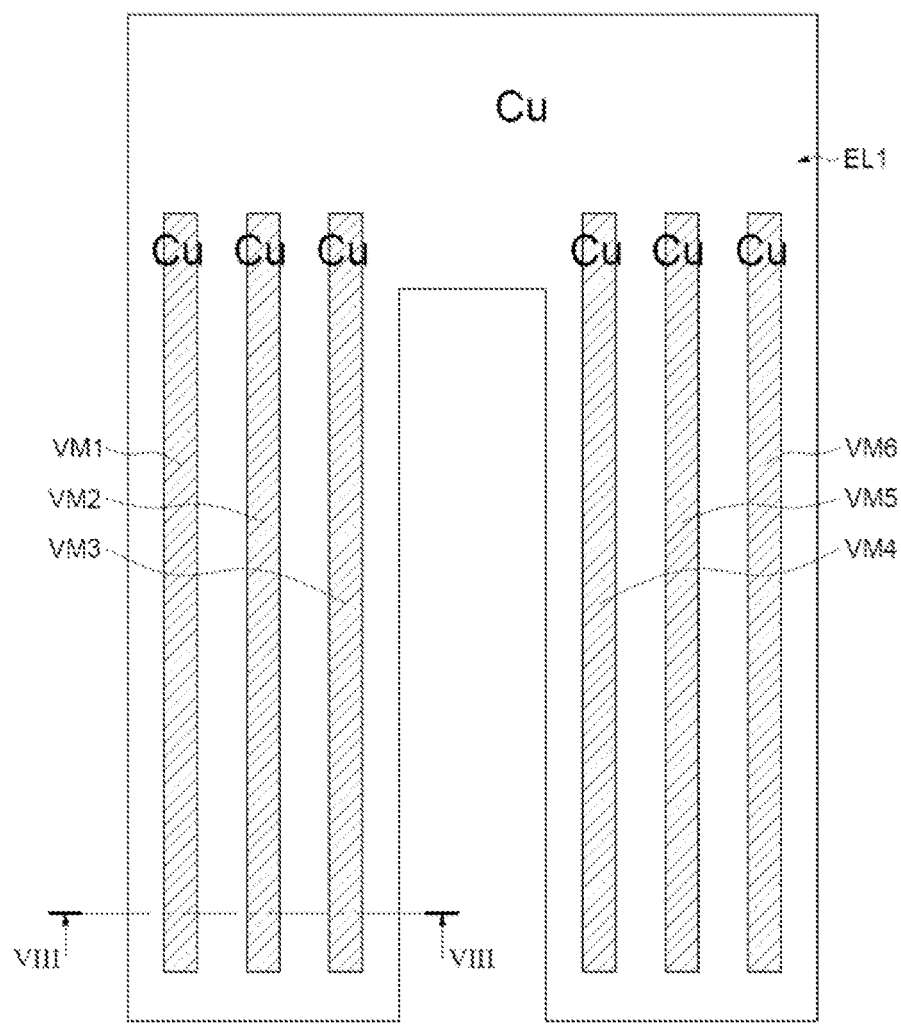
Figure 8:
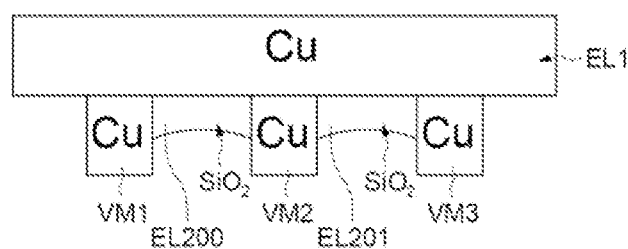

Another alternative embodiment of the elements EL1 and EL2 is illustrated schematically in FIGS. 7 and 8, the latter figure being a section along the line VIII-VIII of FIG. 7.

In this variant, the metal forming the metallization levels and the via levels of the interconnection part RITX is the same. It is, for example, copper (Cu).

The first element EL1 is also U-shaped. It furthermore has metal portions VM1, VM2, VM3 located under the parallel branches of the U at the via level adjacent to the metallization level within which the element EL1 is produced. These metal portions are therefore also made of copper. Conversely, the element EL2 has straight insulating region portions EL200, EL201 comprising silicon dioxide. These straight silicon dioxide portions are in fact residues of silicon dioxide which has remained after the step of de-encapsulating the assembly ENS.

Furthermore, since copper has a coefficient of thermal expansion greater than that of silicon dioxide, in this variant the same situation is encountered as that of the variant illustrated in FIGS. 5 and 6, that is to say here again the structure will bend downwards when there is a rise in temperature.

It should be noted that, in the variant of FIGS. 5 and 6, even if silicon dioxide residues were to remain between the tungsten lines, this would have no effect because the coefficient of thermal expansion of aluminum is also greater than that of silicon dioxide.

Figure 9:
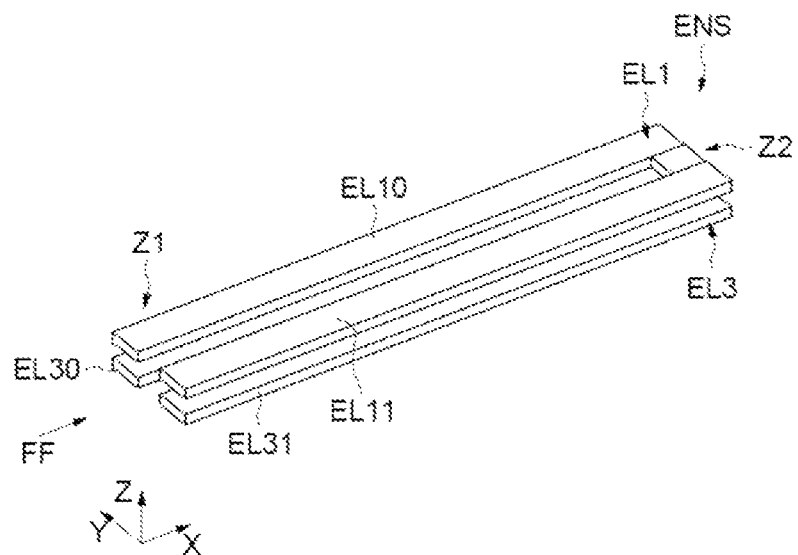
Figure 10:
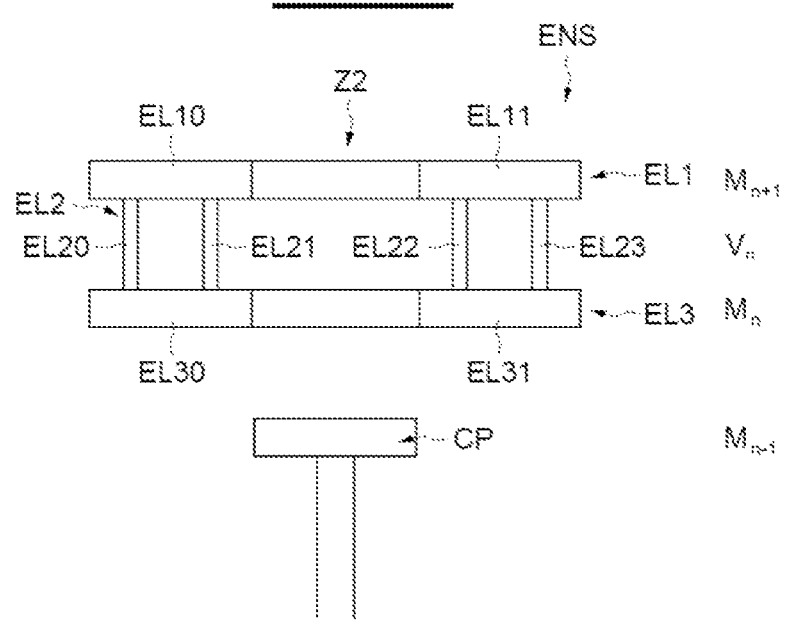

In the embodiment illustrated in FIG. 9, further to the first element EL1, the assembly ENS also has a third element EL3 which is the same as the first element EL1 and located facing this first element ELL As illustrated in FIG. 10, which is a view along the arrow FF in FIG. 9, the first element EL1 is here located at the metallization level $M_{n+1}$ and the third element EL3 is located at the metallization level $M_n$, these two metallization levels being separated by the via level $V_n$.

In the embodiment of FIGS. 9 and 10, the assembly ENS therefore has the shape of a double U.

The assembly ENS furthermore has a connection element located at the via level $V_n$ and secured to the first element EL1 and the third element EL3.

In this example, the connection element has metal portions EL20, EL21, EL22 and EL23. These metal portions are made of tungsten, whereas the elements EL1 and EL3 are made of aluminum.

This connection element, having the metal portions EL20-EL23, therefore forms here a second element EL2 common to the first element and to the third element.

It can also be seen in FIG. 10 that the fixed body CP is this time produced at the metallization level $M_{n-1}$.

During the de-encapsulation of such an assembly ENS, it does not bend as illustrated in FIG. 3 owing to the symmetrical nature of the assembly ENS and an equilibrium of tensile stresses.

Likewise, such an assembly is insensitive to variations in ambient temperature because any possible deformation of the element EL1 is counteracted by the deformation of the element EL3 in the opposite direction.

Figure 11:
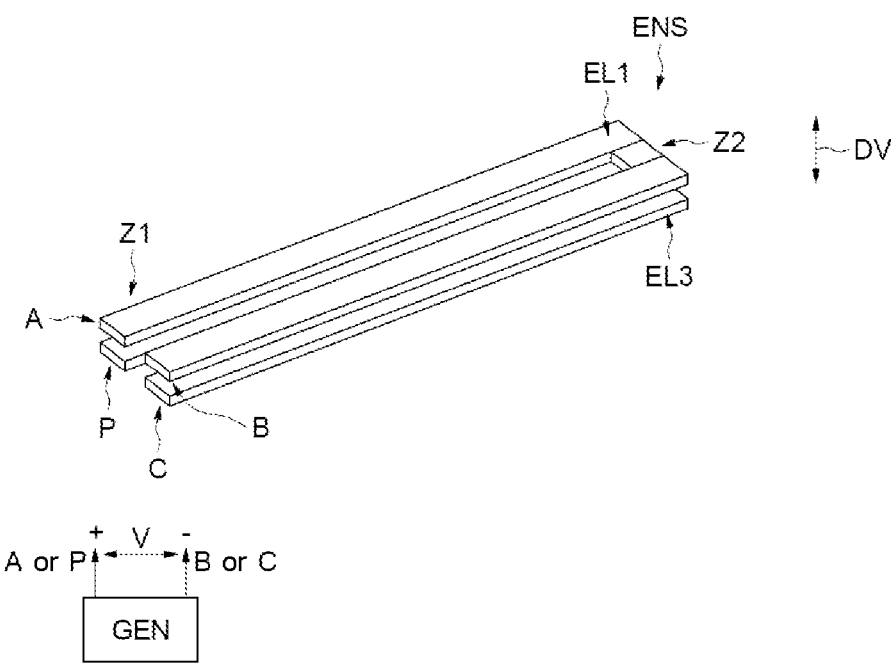

Conversely, as illustrated in FIG. 11, depending on whether a voltage V is applied between points A and B of the end zone Z1 or between points P and C of this end zone, the free end zone Z2 of the assembly ENS will bend in one direction or the other along the vertical direction DV.

This is because if a voltage V is applied between the points A and B, the effect of which will then be to make a current flow mainly in the element EL1 (since the electrons will take the shortest path to flow through), the temperature of the element in EL1 will rise more greatly than that of the element EL3, which will lead to bending of the zone Z2 downwards.

Conversely, if this voltage is applied between the points P and C of the end zone Z1, the current will flow mainly through the third element EL3, and this time the free end zone Z2 will bend upwards.

It would of course also be possible to produce a double U made of copper with the metal portions EL20-EL23 made of copper in so far as straight silicon dioxide portions remain in contact on the one hand with the element EL1 and in contact on the other hand with the element EL3, these straight silicon dioxide portions being similar to those referenced EL200 and EL201 in FIG. 8.

Figure 12:
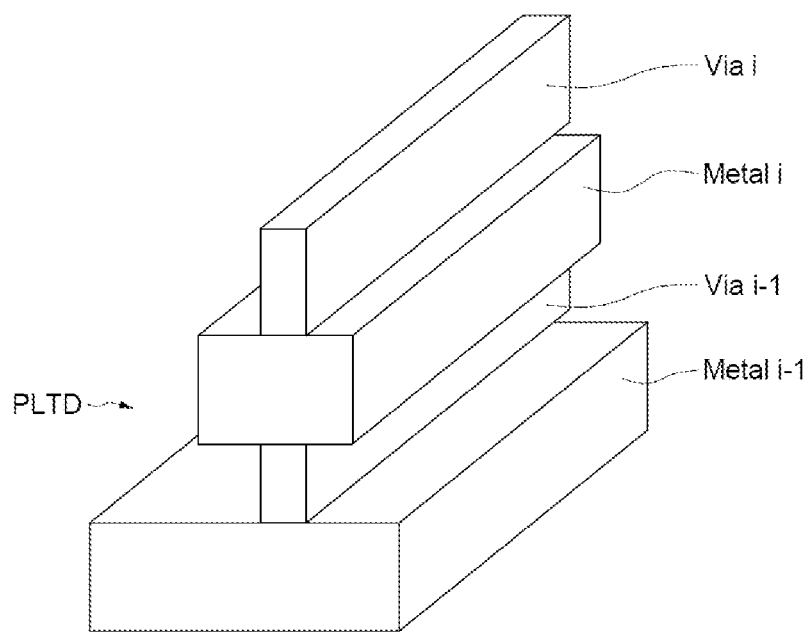
Figure 13:
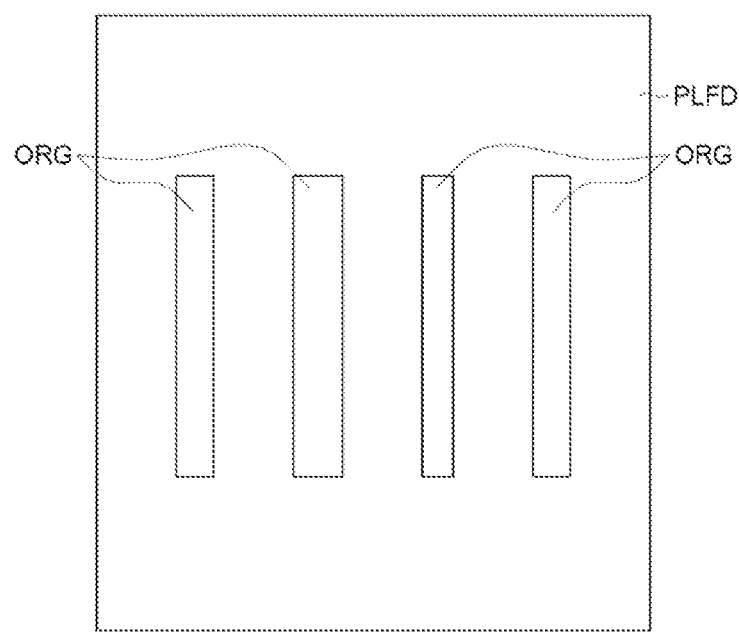
Figure 14:
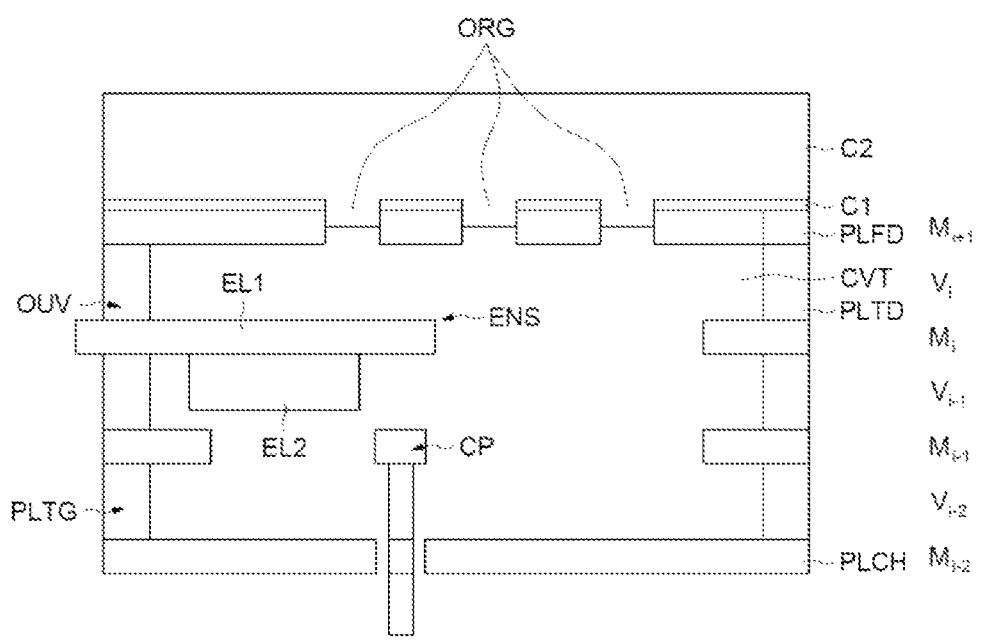

Reference will now be made more particularly to FIGS. 12 to 14 in order to illustrate a way of manufacturing an exemplary embodiment of a device according to the invention.

It is assumed in these figures that the element EL1 is produced at the metallization level $M_i$, that the element EL2 is produced at the via level $V_{i-1}$, and that the fixed body is produced at the metallization level $M_{i-1}$.

Furthermore, as illustrated in FIG. 14, the bottom wall PLCH of the cavity CVT is produced at the metallization level $M_{i-2}$ whereas the bottom wall PLFD of the cavity CVT is produced at the metallization level $M_{i+1}$.

It is also assumed that the cavity is closed on the right by a side wall PLTD and on the left by a side wall PLTG having the opening OUV.

It is then seen in FIG. 12 that the various via and metallization levels are used in order to form in particular the side wall PLTD but also the wall PLTG, and to form a "protective barrier" for the oxide etching which will follow, and thus make it possible to de-encapsulate the assembly ENS and the fixed body CP.

The device DIS is produced by using the conventional steps for manufacturing the metallization and via levels. More precisely, the various elements and bodies are produced in the conventional way by etching an underlying oxide and depositing metal in the trenches produced in this way. Next, oxide covering is carried out in order to continue to produce the upper metallization and via levels.

After formation of a conventional nitride layer C1 on the metallization level $M_{i+1}$, a comb is produced in this metallization level so as to form holes ORG (FIG. 13).

Next, etching is carried out with hydrogen sulfide vapour so as to remove the insulating region (oxide) encapsulating the assembly ENS as well as the fixed body CP.

Non-conformal oxide deposition is then carried out, so as to form a layer C2 plugging the holes ORG.

The conventional method for producing the various upper metallization levels is then carried out.

Moreover, during the production of the wall PLTG, the opening OUV was made so that the element EL1 is at a distance from these edges, that is to say the wall PLFD on the one hand and the wall PLTG on the other hand.

Furthermore, in order to facilitate non-contact between the assembly ENS and the walls of the opening OUV, it is preferable for the element EL2 to remain in the cavity and for only the element EL1 to pass through the opening OUV.

Although not indispensable, it may be advantageous to place an external element at the opening OUV, preventing de-encapsulation liquid from flowing out of the cavity CVT through the opening OUV, so as to limit possible degradation of the other elements of the integrated circuit which are arranged outside the cavity CVT. Such an external element is described, for example, in French Patent Application No 13 50 161 and U.S. counterpart application Ser. No. 14/148,884 (filed Jan. 7, 2014).

What is claimed is:

1. An integrated circuit, comprising:
a substrate;
an interconnection region overlying the substrate, the interconnection region comprising a plurality of metallization levels and a via level;
a device comprising a thermally deformable electrically conductive assembly extending at least partly in a cavity of the interconnection region, the device further comprising a free end zone that is mobile in the cavity in a movement direction substantially perpendicular to mid-planes of the metallization levels, and a fixed end zone, opposite the free end zone, that is located outside the cavity, the thermally deformable electrically conductive assembly comprising:
a first element located within a first metallization level of the plurality of metallization levels, the first element extending from the fixed end zone into the cavity;
a second element secured to an underside of the first element and located within the via level, which is adjacent to the first metallization level, the second element extending from the fixed end zone into the cavity, the first element and the second element respectively having materials with different coefficients of thermal expansion, wherein a length of the first element is greater than a length of the second element; and
an electrically conductive body arranged at least partly in the cavity, the thermally deformable electrically conductive assembly having different configurations corresponding respectively to different distances along a direction between the free end zone and the electrically conductive body, the thermally deformable electrically conductive assembly being activatable in order to change from one configuration to another, wherein one of the configurations corresponds to a zero distance such that only the first element at the free end zone is in physical contact with the electrically conductive body so as to establish an electrical connection passing through the electrically conductive body and the thermally deformable electrically conductive assembly.

2. The integrated circuit according to claim 1, wherein the first element comprises aluminum and the second element comprises tungsten.

3. The integrated circuit according to claim 1, wherein the first element comprises a first metal that is the same as the metal of the first metallization level, and the second element comprises at least one metal portion having a second metal that is different than the first metal.

4. The integrated circuit according to claim 3, wherein the first metal comprises aluminum and the second metal comprises tungsten.

5. The integrated circuit according to claim 1, wherein the first element of the thermally deformable electrically conductive assembly is U-shaped having two parallel branches connected by a connecting branch.

6. The integrated circuit according to claim 5, wherein the free end zone of the thermally deformable electrically conductive assembly includes the connecting branch and wherein the second element of the thermally deformable electrically conductive assembly has a straight portion extending under each of the two parallel branches as far as the free end zone.

7. The integrated circuit according to claim 1, wherein the thermally deformable electrically conductive assembly is thermally activatable.

8. The integrated circuit according to claim 1, wherein the thermally deformable electrically conductive assembly is electrically activatable, the first element being configured in order to allow an electrical current to flow through it at least partly, in order to increase its temperature.

9. The integrated circuit according to claim 8, further comprising a voltage generator coupled to apply an electrical voltage between two points of the first element so as to generate the current.

10. The integrated circuit according to claim 1, wherein a width of the first element is constant along the length of the first element, and wherein a width of the second element is constant along the length of the second element.

11. An integrated circuit, comprising:
a semiconductor substrate;
integrated circuitry disposed at an upper surface of the semiconductor substrate;
a device overlying the substrate and spaced from the integrated circuitry, the device comprising:
a first element formed in a cavity in an insulating region overlying the semiconductor substrate, the first element having a fixed end zone that is located outside the cavity and a free end zone that is located inside the cavity and is mobile relative to the fixed end zone and movable in a movement direction substantially perpendicular to the upper surface of the semiconductor substrate;
a second element secured to the fixed end zone of the first element and extending into the cavity, the second element being secured to an underside of the first element, the second element having a material with a different coefficient of thermal expansion than a material of the first element, wherein a length of the first element is greater than a length of the second element; and
an electrically conductive body adjacent the free zone of the first element, the device having different configurations corresponding to different distances along a direction between the free end zone and the electrically conductive body, one of the different configurations being a zero distance configuration in which only the first element physically contacts the electrically conductive body.

12. The integrated circuit according to claim 11, wherein the device has different configurations based on temperature.

13. The integrated circuit according to claim 11, wherein the device has different configurations based on an electrical current flowing through the first element.

14. The integrated circuit according to claim 11, wherein the first element comprises aluminum and the second element comprises copper.

15. The integrated circuit according to claim 11, wherein the first element is formed in a first metallization level and the second element is formed in a first via level, the first metallization level and the first via level having other portions that form at least part of an interconnect structure that electrically connects portions of the integrated circuitry.

16. The integrated circuit according to claim 11, wherein the first element of the device is U-shaped having two parallel branches connected by a connecting branch.

17. The integrated circuit according to claim 11, wherein a width of the first element is constant along the length of the first element, and wherein a width of the second element is constant along the length of the second element.

* * * * *